United States Patent
Mann et al.

(10) Patent No.: US 9,299,591 B1
(45) Date of Patent: Mar. 29, 2016

(54) IMPLEMENTING INTEGRATED CIRCUIT CHIP ATTACH IN THREE DIMENSIONAL STACK USING VAPOR DEPOSITED SOLDER CU PILLARS

(71) Applicant: International Business Machines Corporation, Armonk, NY (US)

(72) Inventors: Phillip V. Mann, Rochester, MN (US); Kevin M. O'Connell, Rochester, MN (US); Arvind K. Sinha, Rochester, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/698,224

(22) Filed: Apr. 28, 2015

Related U.S. Application Data

(63) Continuation of application No. 14/598,352, filed on Jan. 16, 2015.

(51) Int. Cl.
| | | |
|---|---|---|
| *H01L 21/44* | (2006.01) | |
| *H01L 21/48* | (2006.01) | |
| *H01L 23/00* | (2006.01) | |
| *H01L 25/065* | (2006.01) | |

(52) U.S. Cl.
CPC .......... *H01L 21/4882* (2013.01); *H01L 24/11* (2013.01); *H01L 25/0657* (2013.01); *H01L 2224/11466* (2013.01); *H01L 2225/06589* (2013.01); *H01L 2924/01029* (2013.01)

(58) Field of Classification Search
CPC .. H01L 21/4882; H01L 24/11; H01L 25/0657
See application file for complete search history.

(56) References Cited

U.S. PATENT DOCUMENTS

| | | | |
|---|---|---|---|
| 7,159,758 B1 * | 1/2007 | Downes | B23K 1/0016 228/248.1 |
| 8,546,930 B2 | 10/2013 | Bakir et al. | |
| 8,581,392 B2 | 11/2013 | Knickerbocker et al. | |
| 8,629,554 B2 | 1/2014 | Bernstein et al. | |
| 2007/0008701 A1 * | 1/2007 | Cheng | H01L 23/467 361/700 |
| 2009/0057879 A1 | 3/2009 | Garrou et al. | |
| 2009/0085197 A1 * | 4/2009 | Ajmera | H01L 23/427 257/713 |
| 2009/0251862 A1 | 10/2009 | Knickerbocker et al. | |
| 2009/0261457 A1 * | 10/2009 | Pratt | H01L 21/76898 257/621 |
| 2009/0294916 A1 * | 12/2009 | Ma | H01L 23/481 257/621 |
| 2010/0171209 A1 * | 7/2010 | Tanie | H01L 23/481 257/686 |
| 2011/0001250 A1 * | 1/2011 | Lin | H01L 23/49816 257/778 |
| 2011/0095435 A1 * | 4/2011 | Volant | H01L 21/76898 257/774 |
| 2011/0115070 A1 * | 5/2011 | Lim | H01L 21/563 257/698 |
| 2011/0317385 A1 * | 12/2011 | Zhou | H01L 23/3171 361/771 |

(Continued)

FOREIGN PATENT DOCUMENTS

JP 06342991 A 12/1994

OTHER PUBLICATIONS

Appendix P—List of IBM Patents or Patent Applications Treated as Related—Jun. 14, 2015.

*Primary Examiner* — Nicholas Tobergte
(74) *Attorney, Agent, or Firm* — Joan Pennington

(57) ABSTRACT

A method and structures are provided for implementing individual integrated circuit chip attach in a three dimensional (3D) stack. A plurality of hollow copper pillars is formed, and the hollow copper pillars are coated with lead free solder using vapor deposition.

1 Claim, 3 Drawing Sheets

(56) References Cited

U.S. PATENT DOCUMENTS

2014/0231635 A1\* 8/2014 Kerness ............... G01S 17/026 250/226

2015/0221613 A1\* 8/2015 Andry ................. H01L 25/0657 257/770

\* cited by examiner

US 9,299,591 B1

IMPLEMENTING INTEGRATED CIRCUIT CHIP ATTACH IN THREE DIMENSIONAL STACK USING VAPOR DEPOSITED SOLDER CU PILLARS

This application is a continuation application of Ser. No. 14/598,352 filed Jan. 16, 2015.

FIELD OF THE INVENTION

The present invention relates generally to the data processing field, and more particularly, relates to a method and structures for joining individual chips in a three dimensional (3D) stack using vapor deposited solder copper pillars.

DESCRIPTION OF THE RELATED ART

Emerging three-dimensional (3D) integration technology offers tremendous benefits. Intense research activities are going on about technology, simulation, design, and product prototypes.

A need exists for an effective and efficient method and structure to attach individual chips in a three dimensional (3D) stack.

SUMMARY OF THE INVENTION

Principal aspects of the present invention are to provide a method and structures for implementing individual integrated circuit chip attach in a three dimensional (3D) stack. Other important aspects of the present invention are to provide such method and structure substantially without negative effects and that overcome many of the disadvantages of prior art arrangements.

In brief, a method and structures are provided for implementing individual integrated circuit chip attach in a three dimensional (3D) stack. A plurality of hollow copper pillars is formed, and the hollow copper pillars are coated with lead free solder using vapor deposition.

In accordance with features of the invention, the hollow copper pillars increase the thermal conduction and strength of the vapor deposited solder.

In accordance with features of the invention, once the deposited solder has been attached via reflow, an Al(Cu) alloy is vapor deposited to mitigate electromigration issues which arises due to roughness of the plating lines and alignment issues.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing individual integrated circuit chip attach in a three dimensional (3D) stack.

Figure 1:
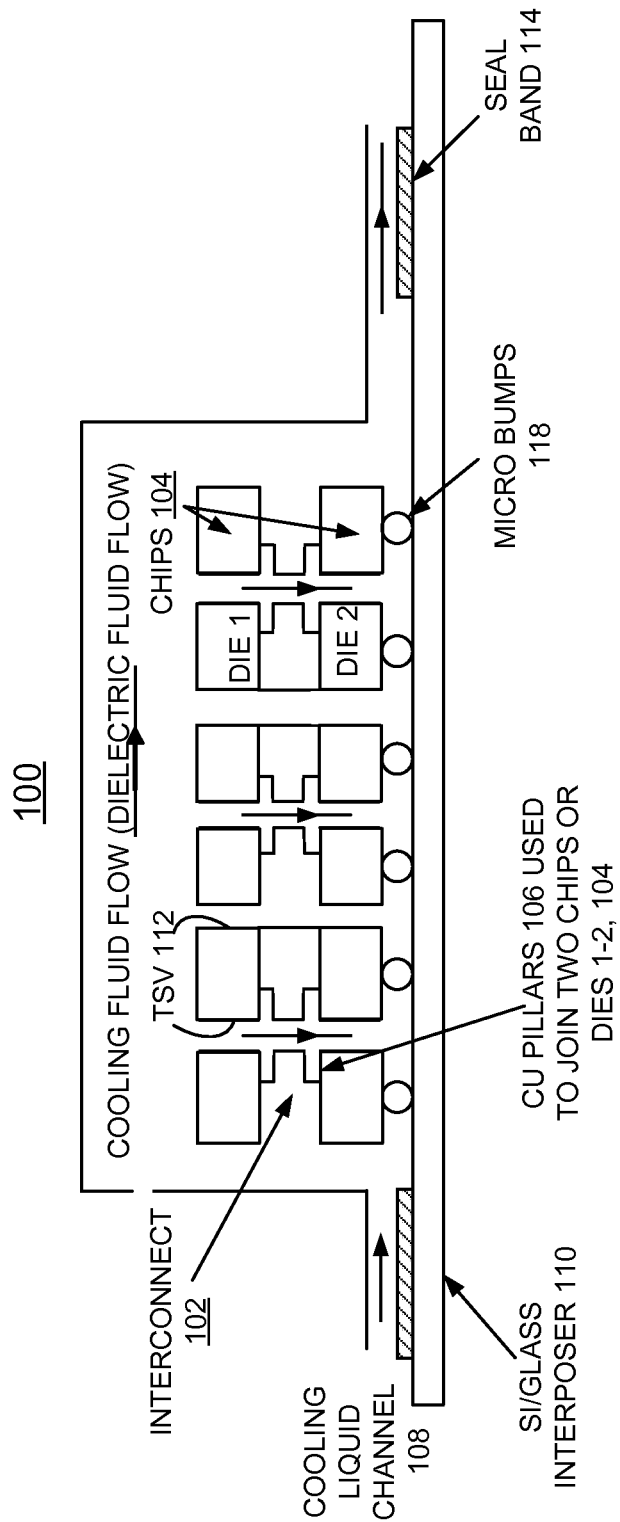
FIG. 1 illustrates an example three dimensional (3D) stack assembly including a novel interconnect in accordance with the preferred embodiment.

Having reference now to the drawings, in FIG. 1, there is shown an example three dimensional (3D) stack assembly generally designated by reference character 100 in accordance with preferred embodiments. The chip stack assembly 100 includes a novel interconnect generally designated by reference character 102.

The chip stack assembly 100 includes a first chip or die 1, 104 and a second chip or die 2, 104 attached together by the interconnect 102. The interconnect 102 includes a plurality of soldered hollow copper columns 106. The hollow copper pillars 106 are coated with lead free solder using vapor deposition. The Cu pillars 106 increase the thermal conduction and strength of the solder. Once the deposited solder has been attached via reflow, an aluminum copper Al(Cu) alloy is vapor deposited to mitigate electromigration issues which arise, for example, due to roughness of the plating lines and alignment issues, which otherwise can cause high current density resulting in material transfer.

A cooling liquid channel 108 is provided between a substrate 110, such as a silicon and/or glass interposer 110 and the 3D stack. The interconnect 102 and the cooling liquid open channel 108 provide a cooling path for the assembly 100. Cooling fluid flows through TSVs (through silicon vias) 112 extending through the first chip 1, 104, through soldered hollow copper columns 106 between the chips, and through TSVs 112 on the second chip 2, 104. A seal band 114 is provided at an entrance and an exit of the cooling liquid open channel 108. A plurality of micro bumps 118 provides connections between the chip stack assembly 100 and the interposer 110.

Figure 2:
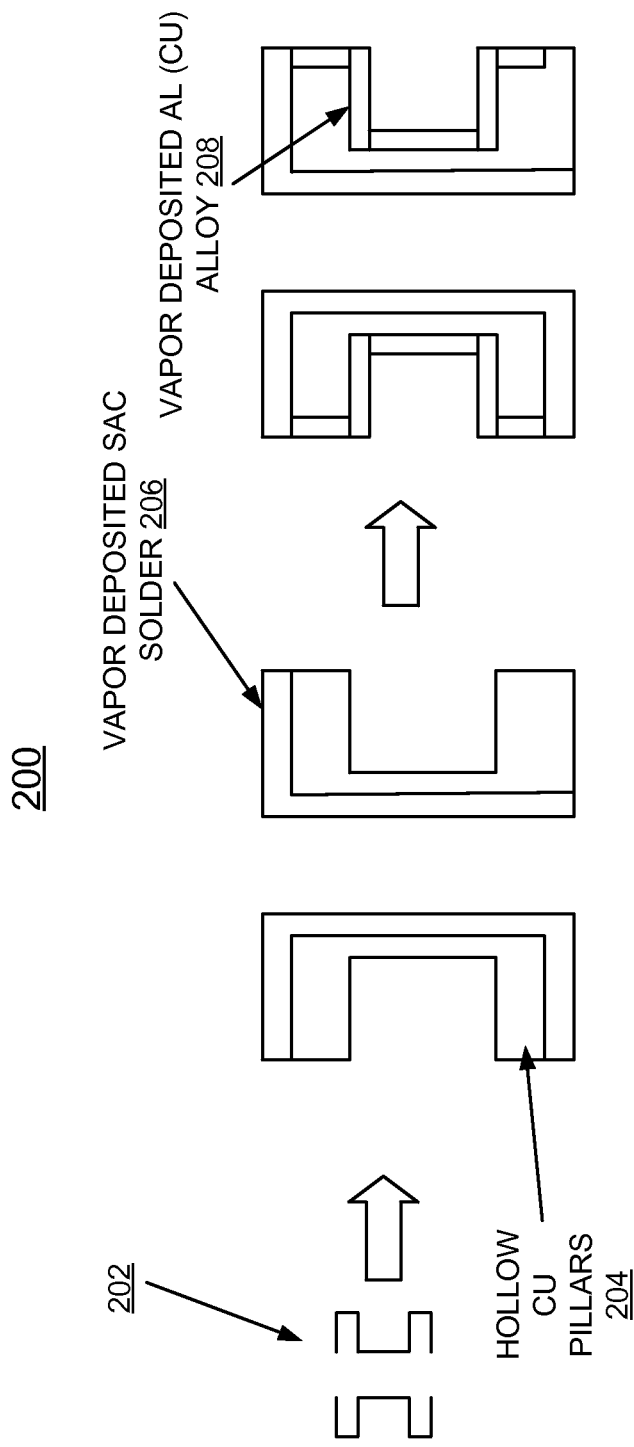
FIG. 2 illustrates an example structure for implementing an individual interconnect between the two individual integrated circuit chips in the three dimensional (3D) stack of FIG. 1 in accordance with the preferred embodiment.

Referring also to FIG. 2, there are shown an example structures and process steps generally designated by reference character 200 for implementing the interconnect 102 between the two individual integrated circuit chips in the three dimensional (3D) stack assembly 100 of FIG. 1 in accordance with the preferred embodiment. First as indicated by reference character 202, TSVs are created for copper pillars. Next, as indicated by reference character 204, hollow CU pillars 204 are formed, and SAC solder as indicated by reference character 206 is vapor deposited. Next as indicated by reference character 208, an AL (CU) alloy is vapor deposited.

Figure 3:
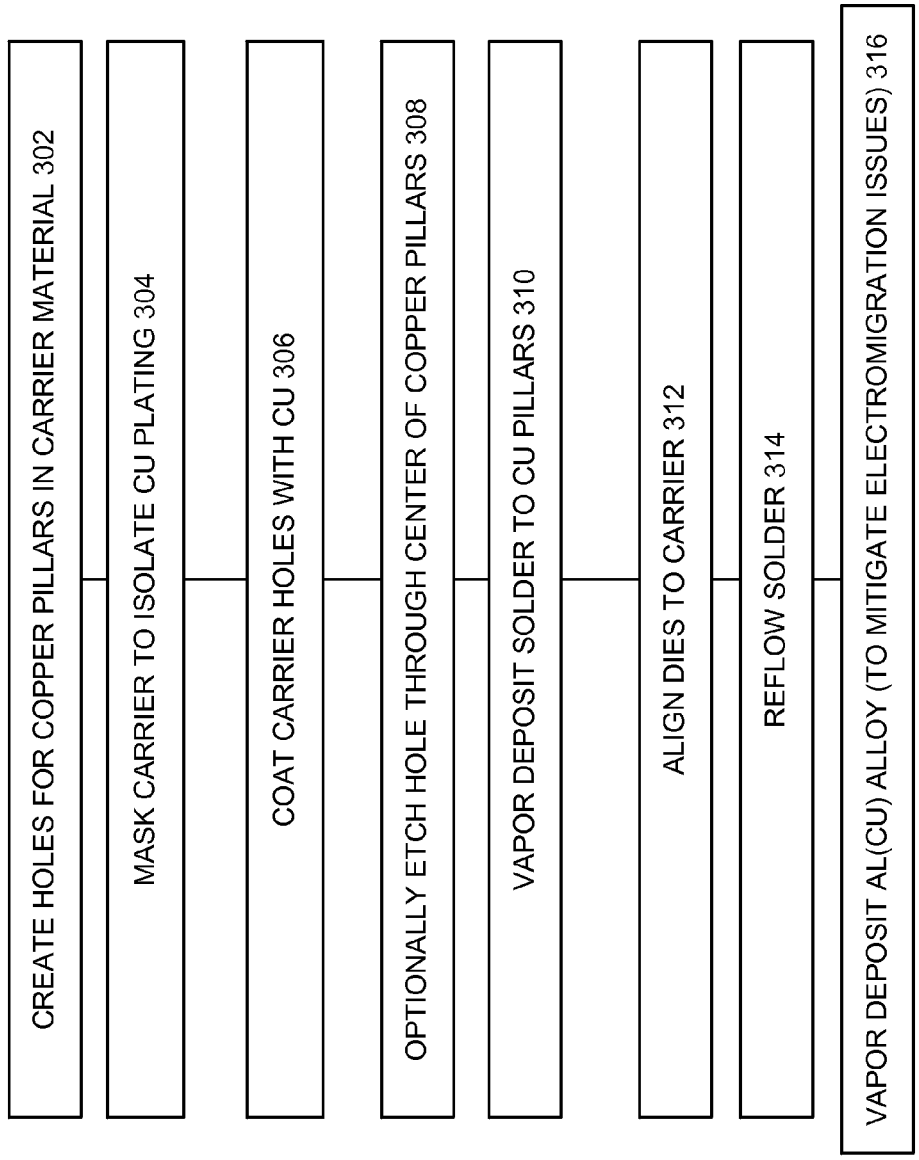
FIG. 3 is a flow chart illustrating exemplary steps for forming hollow copper pillars and implemented between IC dies in accordance with the preferred embodiment.

Referring now to FIG. 3, there are shown exemplary steps for forming hollow copper pillars and implemented between IC dies in accordance with the preferred embodiment. As indicated in a block 302, holes are created for copper pillars in a carrier material. The carrier is masked to isolate copper plating as indicated in a block 304 and the carrier holes are coated with copper as indicated in a block 306. Next solder is vapor deposited to the copper pillars 310. The chip dies are aligned to the carrier 312 and reflow solder attached as indicated in a block 314. Once the deposited solder has been attached via reflow, an aluminum copper Al(Cu) alloy is vapor deposited for electromigration mitigation as indicated in a block 316.

While the present invention has been described with reference to the details of the embodiments of the invention shown in the drawing, these details are not intended to limit the scope of the invention as claimed in the appended claims.

What is claimed is:

1. A method for implementing an interconnect for individual integrated circuit (IC) chip attach in a three dimensional (3D) stack comprising:
   providing an interconnect for joining IC chips and providing holes for copper pillars in a carrier material;
   forming said interconnect with a plurality of hollow copper pillars,
   coating said hollow copper pillars with lead free solder using vapor deposition;
   masking the carrier material to isolate copper plating and coating the holes with copper;
   vapor depositing solder to the copper pillars;
   aligning the IC chips with the carrier, and reflow soldering; and
   vapor depositing an aluminum copper alloy to the reflow soldered copper pillars.

* * * * *